(12) United States Patent
Kokubun

(10) Patent No.: US 7,113,215 B2
(45) Date of Patent: Sep. 26, 2006

(54) CMOS IMAGE SENSOR

(75) Inventor: Masatoshi Kokubun, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 821 days.

(21) Appl. No.: 10/319,516

(22) Filed: Dec. 16, 2002

(65) Prior Publication Data

US 2003/0146994 A1 Aug. 7, 2003

(30) Foreign Application Priority Data

Feb. 4, 2002 (JP) ............................. 2002-027277

(51) Int. Cl.
*H04N 3/14* (2006.01)
(52) U.S. Cl. ..................... 348/308; 348/294; 348/301
(58) Field of Classification Search ................ 348/308, 348/294, 301, 302; 257/291; 250/208.1
See application file for complete search history.

(56) References Cited

U.S. PATENT DOCUMENTS

| 5,065,171 | A | 11/1991 | Miyake et al. |
| 5,122,649 | A | 6/1992 | Murayama et al. |
| 5,136,358 | A | 8/1992 | Sakai et al. |
| 6,201,573 | B1 | 3/2001 | Mizuno |
| 6,452,149 | B1 * | 9/2002 | Yamashita et al. .......... 348/294 |
| 6,927,433 | B1 * | 8/2005 | Hynecek ..................... 257/292 |

FOREIGN PATENT DOCUMENTS

EP 1 049 171 11/2000

\* cited by examiner

*Primary Examiner*—Tuan Ho
*Assistant Examiner*—Gevell Selby
(74) *Attorney, Agent, or Firm*—Westerman, Hattori, Daniels & Adrian, LLP.

(57) ABSTRACT

A low-power CMOS image sensor that gets distinct images in which interference does not occur between adjacent pixels without changing an element in a circuit. Each of pixel circuits arranged like a matrix converts incident light into electrical signals with a photoelectric conversion element. Image signals output from pixel circuits adjacent to each other in a horizontal direction are input to a signal processing circuit in each column, undergo predetermined signal processing, and are switched and output in order by a horizontal scanning circuit. The signal processing circuits are arranged and each of fixed potential wirings parallel to one another is located between adjacent signal processing circuits. Therefore, adjacent signal processing circuits are electrically shielded by a fixed potential wiring.

12 Claims, 8 Drawing Sheets

CMOS IMAGE SENSOR

CROSS-REFERENCE TO RELATED APPLICATION

This application is based upon and claims priority of Japanese Patent Application No.2002-027277, filed on Feb. 4, 2002, the contents being incorporated herein by reference.

BACKGROUND OF THE INVENTION (1) Field of the Invention

This invention relates to a CMOS image sensor for getting images by outputting in order image signals sensed in each of pixel areas arranged like a matrix on the basis of X-Y addressing.

(2) Description of the Related Art

With the spread of digital still-image cameras and digital video cameras, the addition of a camera function to cellular telephones, and the like, a demand for solid imaging devices has risen in recent years. At present charge coupled devices (CCDs) have spread most widely as solid imaging devices. However, these CCDs have the drawbacks of the need of a plurality of power supply circuits, a high driving voltage, and high power consumption. Therefore, attention has recently been riveted to CMOS image sensors which can be produced by the process for producing complementary metal-oxide semiconductors (CMOSes), which can operate at a low voltage, which consume only a small amount of power, and the unit cost of the production of which is low.

In CMOS image sensors, pixel circuits each of which gets an image corresponding to one pixel are arranged like a matrix. They output image signals corresponding to an entire image by selecting in order output from each pixel circuit with a vertical scanning shift register and horizontal scanning shift register.

FIG. 7 is a view showing the structure of a pixel circuit in a conventional CMOS image sensor.

A pixel circuit 70 shown in FIG. 7 includes a photodiode D71 as a photoelectric conversion element and has an active pixel sensor (APS) structure in which a reset transistor M71, source follower amplifier M72, and row selection transistor M73 each formed by, for example, an n-channel MOS field-effect transistor (MOSFET) are located.

The anode side of the photodiode D71 is grounded and the cathode side is connected to a source electrode on the reset transistor M71 and a gate electrode on the source follower amplifier M72. A drain electrode on the reset transistor M71 and a drain electrode on the source follower amplifier M72 are connected to a power supply line L71 where reset voltage VR is supplied. A gate electrode on the reset transistor M71 is connected to a reset signal line L72 where a reset signal RST is supplied.

A source electrode on the source follower amplifier M72 is connected to a drain electrode on the row selection transistor M73. A gate electrode on the row selection transistor M73 is connected to a row selection signal line L73 where a row selection signal SLCT for selecting the pixel circuit 70 in a row direction is supplied. A source electrode on the row selection transistor M73 is connected to a column selection signal line L74 for selecting the pixel circuit 70 in a column direction.

Operation in the pixel circuit 70 will now be described in brief. First, the photodiode D71 is charged by reset voltage VR when the reset transistor M71 goes into the ON state with predetermined timing due to a reset signal RST. Next, when light strikes it, the photodiode D71 begins to discharge and its potential drops from the reset voltage VR. After a predetermined period of time elapsed, a row selection signal SLCT is input to the gate electrode on the row selection transistor M73. When the row selection transistor M73 goes into the ON state, the voltage of the source of the source follower amplifier M72 is gotten as a signal voltage via the column selection signal line L74.

The column selection signal line L74 is connected to, for example, a drain electrode on a column selection transistor (not shown) via an amplifier/noise cancel circuit (not shown). In a CMOS image sensor, each of the pixel circuits 70 arranged in a horizontal direction is selected by a row selection signal SLCT, the column selection transistors each connected to the column selection signal line L74 are put in order into the ON state, and image signals corresponding to one pixel are output in order.

By the way, with CMOS image sensors having the above APS structure, reset noise produced at the source electrode on the reset transistor M71 at the time of a reset signal RST being put into the OFF state will degrade output image signals. The pixel circuits 70 differ from one another in this reset noise due to, for example, variation in threshold voltage VT for the reset transistors M71. Conventionally, correlated double sampling (CDS) circuits have been used to reduce this reset noise.

A CDS circuit is located in each column in the amplifier/noise cancel circuit connected to each column selection signal line L74. The relation between the operation of this CDS circuit and each pixel circuit 70 is as follows. A signal voltage output from the pixel circuit 70 is sampled first by the CDS circuit. Then the photodiode D71 in the pixel circuit 70 is reset to reset voltage VR and voltage output from the pixel circuit 70 at the time of a reset is sampled by the CDS circuit. And then the difference between the voltage output at the time of a reset and signal voltage is calculated. This cancels out reset noise and only image signals can be extracted.

By the way, with CMOS image sensors, the integration level of circuits is getting high due to demands for high resolution. However, a high integration level will lead to a narrow space between signal wirings. As a result, interference will occur between signals transmitted over adjacent signal wirings due to parasitic capacitance. If this interference is significant, distinct images cannot be gotten.

As described above, a CDS circuit for reducing reset noise is located in each column. FIG. 8 is a view for intelligibly describing how to locate CDS circuits in circuits in a conventional CMOS image sensor.

As shown in FIG. 8, CDS circuits 80 are arranged in a horizontal direction in the same way as the column selection signal lines L74 located parallel to one another by n columns in a horizontal direction. The input side of each CDS circuit 80 is connected to an output section of each pixel circuit 70 via each column selection signal line L74 and the output side is connected to, for example, a drain electrode on each column selection transistor (not shown).

Usually each CDS circuit 80 has the same wiring pattern. Therefore, if the CDS circuits 80 are located parallel to one another in this way, a portion of a signal transmission wiring for transmitting a signal output from the pixel circuit 70 which is located parallel to a signal transmission wiring in an adjacent CDS circuit 80 increases. Therefore, if a high integration level leads to a narrow space between the CDS circuits 80, image signals from pixels adjacent to each other in a horizontal direction will interfere due to parasitic capacitance between the signal transmission wirings. For example, if there are an area with strong brightness and an area with dim brightness on an image gotten, the border between these areas may not be displayed distinctly.

Conventionally, interference between adjacent image signals has been controlled by increasing the capacitance of a capacitive element for sampling included in the CDS circuit 80. Alternatively, the interference has been controlled by increasing operating current for an amplifier located in the CDS circuit 80. With these methods, however, the size of CDS circuits becomes large and consumption of power increases.

SUMMARY OF THE INVENTION

The present invention was made under the background circumstances as described above. An object of the present invention is to provide a low-power CMOS image sensor being able to get distinct images in which interference does not occur between adjacent pixels without changing an element in a circuit.

In order to achieve the above object, a CMOS image sensor for getting images by outputting in order image signals sensed in each of pixel areas arranged like a matrix on the basis of X-Y addressing is provided. This CMOS image sensor comprises a plurality of pixel circuits arranged like a matrix and each including a photoelectric conversion element to make the photoelectric conversion of incident light for outputting the image signals corresponding to one pixel, a plurality of signal processing circuits arranged by the number equal to that of the pixel circuits arranged in a horizontal direction and connected to all the pixel circuits arranged in a vertical direction for performing predetermined signal processing on the image signals from each of all the pixel circuits arranged in the vertical direction, a horizontal scanning circuit for switching and outputting in order the image signals from the plurality of signal processing circuits, and fixed potential wirings parallel to one another and each located between two of the plurality of signal processing circuits arranged.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described with reference to the drawings.

Figure 1:
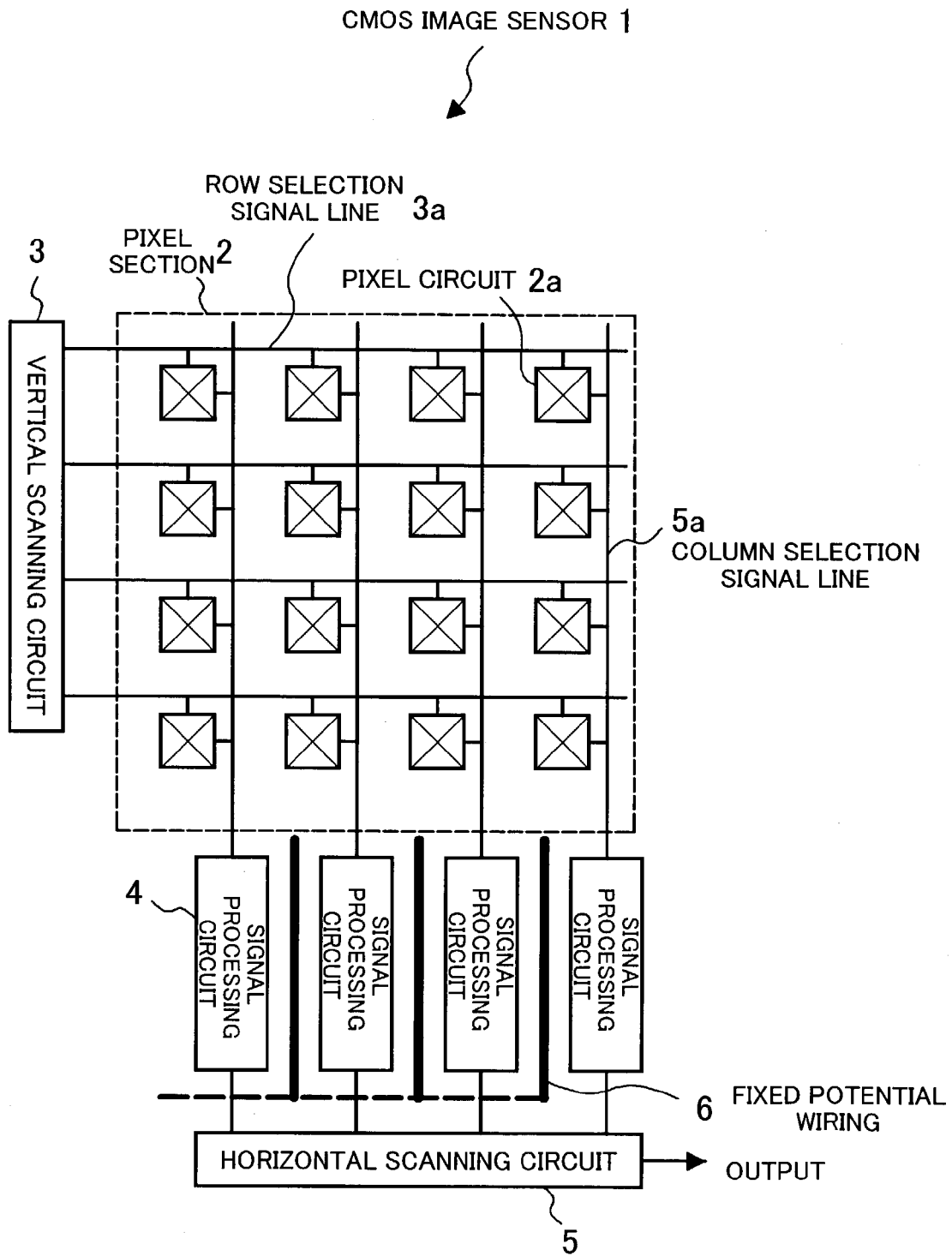
FIG. 1 is a view for describing the principles underlying the present invention.

FIG. 1 is a view for describing the principles underlying the present invention. An overview of the present invention will be given by using FIG. 1.

A CMOS image sensor 1 shown in FIG. 1 comprises a pixel section 2 where pixel circuits 2a are arranged like a matrix, a vertical scanning circuit 3 for selecting output from a row of pixel circuits 2a, signal processing circuits 4 for performing predetermined signal processing on image signals output from pixel circuits 2a in each column, and a horizontal scanning circuit 5 for switching and outputting image signals from each signal processing circuit 4. Each of fixed potential wirings 6 having constant potential is located between the signal processing circuits 4. The pixel circuits 2a are arranged in four rows and four columns in the pixel section 2 in FIG. 1, but in reality more pixel circuits 2a will be arranged there.

In the pixel section 2, one row selection signal line 3a is connected to each horizontal row of pixel circuits 2a and one column selection signal line 5a is connected to each vertical column of pixel circuits 2a. Each pixel circuit 2a includes a photoelectric conversion element for making the photoelectric conversion of incident light and outputs image signals corresponding to one pixel to the column selection signal line 5a connected thereto. The vertical scanning circuit 3 selects output from a row of pixel circuits 2a by outputting a row selection signal to any row selection signal line 3a. Image signals output to the column selection signal line 5a are input to the horizontal scanning circuit 5 via the signal processing circuit 4 in each column. The horizontal scanning circuit 5 selects and outputs image signals from each column in order.

All the signal processing circuits 4 on the column selection signal lines 5a have the same circuit structure, perform predetermined signal processing on input image signals, and output them to the horizontal scanning circuit 5. For example, amplifier circuits, noise cancel circuits, or the like are located as the signal processing circuits 4. For example, CDS circuits are located as these noise cancel circuits.

In the CMOS image sensor 1, the column selection signal lines 5a in the columns located from the pixel section 2 to the horizontal scanning circuit 5 are parallel to one another. The signal processing circuits 4 located in the columns are also parallel to one another. The signal processing circuits 4 include signal transmission wirings for transmitting image signals. These signal transmission wirings always include one or more signal transmission wirings for transmitting image signals in a column direction.

In the recent CMOS image sensor 1 with high resolution the integration level of the pixel circuits 2a is high and space between adjacent signal processing circuits 4 is very narrow. Therefore, image signals transmitted in different columns will interfere due to wiring capacitance between signal transmission wirings located in a column direction in adjacent signal processing circuits 4.

In the present invention, the fixed potential wirings 6 having constant potential are located parallel to one another. Each fixed potential wiring 6 is located between adjacent signal processing circuits 4 to electrically shield one from the other. This prevents image signals in different columns from interfering and distinct images without interference between pixels can be gotten.

By the way, on a semiconductor chip having a multilayer structure where the CMOS image sensor 1 is formed, it is preferable that the signal transmission wirings in the signal processing circuits 4 for transmitting image signals from the pixel circuits 2a in the column direction and the fixed potential wirings 6 for shielding signal transmission wirings in each column should always be formed on the same wiring layer. For example, if signal transmission wirings in each signal processing circuit 4 are formed on a plurality of wiring layers, then the fixed potential wirings 6 are formed so that they will correspond to signal transmission wirings on each wiring layer. This prevents interference between image signals in different columns more reliably.

Actually, signal transmission wirings for transmitting image signals are located intricately in each signal processing circuit 4. Therefore, if signal transmission wirings in each signal processing circuit 4 are formed parallel to each other on the same wiring layer, wiring capacitance between them will influence transmitted image signals. In this case, it is preferable that a fixed potential wiring 6 should also be formed between the signal transmission wirings located parallel to each other.

Moreover, CDS circuits may be included as the signal processing circuits 4. Usually these CDS circuits include a capacitive element for sampling image signals from the pixel circuits 2a. If space between CDS circuits in adjacent columns is narrow, interference has a great influence on image signals on signal transmission wirings around this capacitive element. Therefore, it is especially preferable that a fixed potential wiring should be located parallel to signal transmission wirings connected to both ends of a capacitive element in a CDS circuit and signal transmission wirings connected to both ends of a capacitive element in an adjacent CDS circuit between these signal transmission wirings.

The potential of the fixed potential wirings 6 can be set to, for example, GND potential in a circuit or power supply potential supplied to a circuit. In this case, the existing wirings for supplying GND potential or power supply potential should be used as far as possible to connect the fixed potential wirings 6. This not only minimizes a change in a wiring layout on a semiconductor chip or in a multilayer structure attendant on the addition of the fixed potential wirings 6 but prevents the size of circuits from increasing.

With the CMOS image sensor 1, usually not only a color filter of, for example, black but also a wiring of, for example, aluminum for shading light which has an opening only over the pixel section 2 is located to prevent light from striking a portion other than the pixel section 2. In many cases, the signal processing circuits 4 are also located under this wiring for shading light. Usually this wiring for shading light is used as a GND wiring in a circuit. Therefore, by connecting the fixed potential wirings 6 each located between signal processing circuits 4 to the wiring for shading light located over them, the potential of the fixed potential wirings 6 can be made constant without changing a wiring layout considerably.

Judging from layouts, there are many cases where wirings for supplying power supply voltage shared in a circuit to the pixel circuits 2a and the horizontal scanning circuit 5 etc. around the pixel circuits 2a can also be connected easily to the fixed potential wirings 6.

In contrast, by independently locating wirings for supplying voltage to the fixed potential wirings 6, the potential of the fixed potential wirings 6 can be kept constant regardless of variation in, for example, GND potential or power supply potential in a circuit. In this case, the wirings for supplying voltage to the fixed potential wirings 6 should be separated at a wiring pad where voltage is supplied to the chip. Alternatively, a power supply circuit for supplying constant voltage to the fixed potential wirings 6 may be located independently outside the chip. As a result, a stable shielding effect can be obtained by the fixed potential wirings 6.

There are cases where independent reference voltage for sampling operation is supplied to CDS circuits. In these cases, by connecting the fixed potential wirings 6 to wirings for supplying this reference voltage, the potential of the fixed potential wirings 6 can be kept constant regardless of variation in common power supply potential or GND potential.

As described above, with the CMOS image sensor 1 according to the present invention, the fixed potential wirings 6 each located between adjacent signal processing circuits 4 prevent image signals transmitted in adjacent signal processing circuits 4 from interfering. As a result, distinct images can be gotten.

Figure 2:
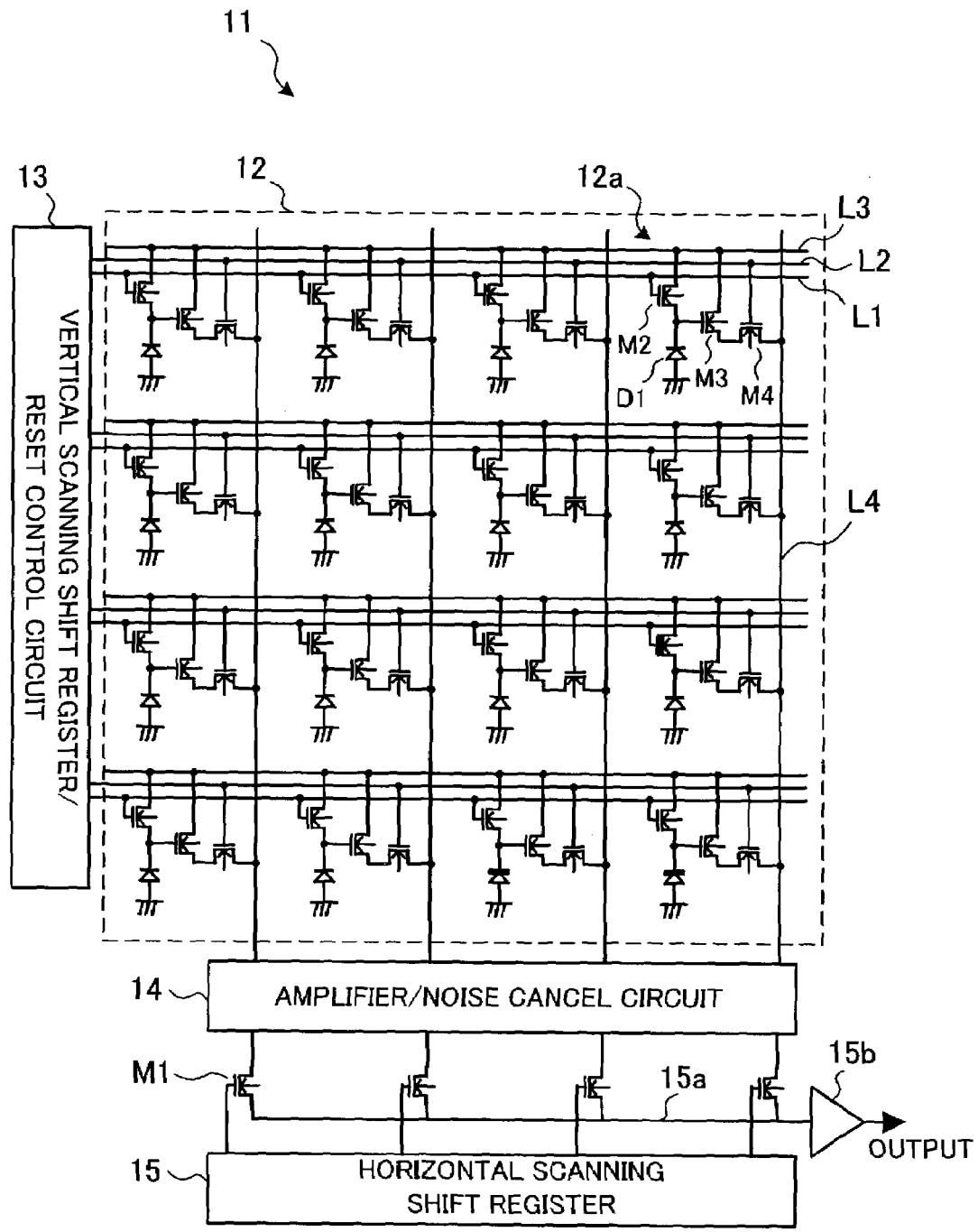
FIG. 2 is a view showing the entire structure of a CMOS image sensor according to an embodiment of the present invention.

Now, a concrete embodiment of the present invention will be described. FIG. 2 is a view showing the entire structure of a CMOS image sensor according to an embodiment of the present invention.

A CMOS image sensor 11 shown in FIG. 2 comprises a pixel section 12 where pixel circuits 12a are arranged like a matrix, a vertical scanning shift register/reset control circuit 13 for, for example, specifying the pixel circuits 12a in a vertical direction, an amplifier/noise cancel circuit 14 for performing the processes of amplifying image signals output from the pixel circuits 12a in each column and reducing noise included in them, and a horizontal scanning shift register 15 for specifying output from the pixel circuits 12a in a horizontal direction by column selection transistors M1. Moreover, an amplifier 15b is connected to an output bus 15a which accepts a signal output from each column selection transistor M1.

The amplifier/noise cancel circuit 14 in FIG. 2 is shown as one functional block, but in reality there is one amplifier/noise cancel circuit 14 for each column of the pixel circuits 12a arranged. Moreover, there are fixed potential wirings each located between amplifier/noise cancel circuits 14 in adjacent columns. These fixed potential wirings will be illustrated later. The pixel circuits 12a are arranged in four rows and four columns in the pixel section 12 in FIG. 2, but in reality more pixel circuits 12a will be arranged there.

Each pixel circuit 12a includes a photodiode D1 as a photoelectric conversion element and has an active pixel sensor (APS) structure in which a reset transistor M2, source follower amplifier M3, and row selection transistor M4 each formed by, for example, an n-channel MOSFET are located.

The anode side of the photodiode D1 is grounded and the cathode side is connected to a source electrode on the reset transistor M2 and a gate electrode on the source follower amplifier M3. A source electrode on the source follower amplifier M3 is connected to a drain electrode on the row selection transistor M4.

Reset signal lines L1 for resetting the photodiodes D1 and row selection signal lines L2 for selecting the pixel circuits 12a in a row direction extend parallel to each row from the vertical scanning shift register/reset control circuit 13. The reset signal line L1 is connected to a gate electrode on the reset transistor M2. The row selection signal line L2 is connected to a gate electrode on the row selection transistor M4. A drain electrode on the reset transistor M2 and a drain electrode on the source follower amplifier M3 are connected to a reset voltage supply line L3.

A source electrode on the row selection transistor M4 is connected to a column selection signal line L4 for selecting the pixel circuits 12a in a column direction. The column selection signal line L4 in each column is connected to a drain electrode on the column selection transistor M1 via the amplifier/noise cancel circuit 14. The structure of the amplifier/noise cancel circuit 14 will be described later in FIG. 3.

A source electrode on each column selection transistor M1 is connected to the output bus 15a. Column selection signals are input in order from the horizontal scanning shift register 15 to a gate electrode on each column selection transistor M1 with predetermined timing. As a result, image signals on which an amplification process and noise reduction process were performed in the amplifier/noise cancel circuit 14 are output in order to the output bus 15a and are sent to an external system via the amplifier 15b.

Now, the operation of the pixel circuits 12a will be described.

First, when a reset signal RST is supplied via the reset signal line L1 and the reset transistor M2 goes into the ON state with predetermined timing, the photodiode D1 is charged by reset voltage VR. Next, electric charges are accumulated in the photodiode D1 when light from the outside strikes it. Signal charges accumulated will decrease the potential of the source of the reset transistor M2 and the potential of the gate of the source follower amplifier M3.

The accumulation of signal charges is begun in this way. After a predetermined period of time elapsed, a row selection signal SLCT is input from the row selection signal line L2 to the gate electrode on the row selection transistor M4. Then voltage output from the source follower amplifier M3 is output to the column selection signal line L4 as an image signal. After that the reset transistor M2 goes into the ON state due to a reset signal RST input and signal charges accumulated in the photodiode D1 are reset.

Figure 3:
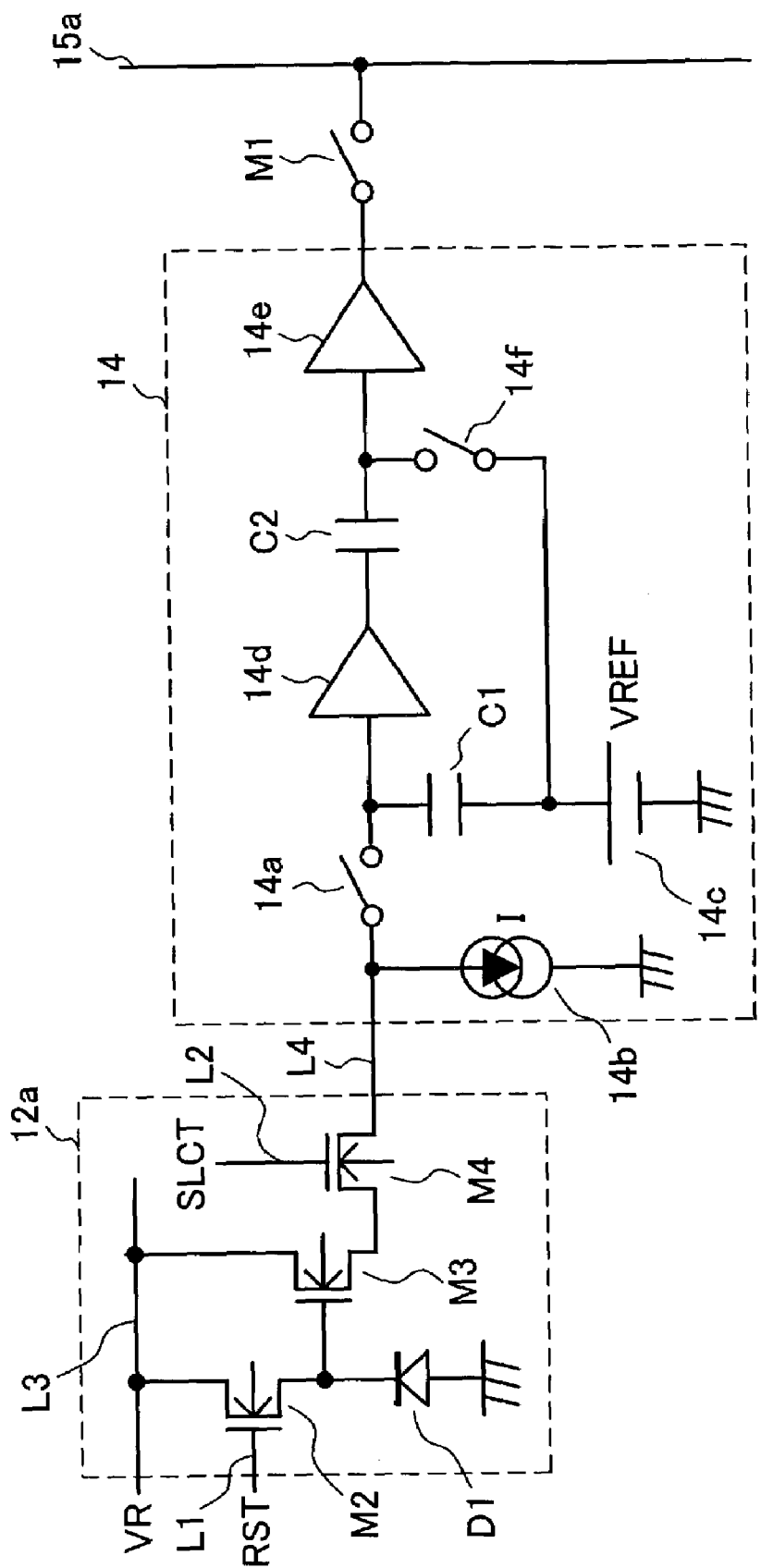
FIG. 3 is a view showing the structure of an amplifier/noise cancel circuit in an embodiment of the present invention.

FIG. 3 is a view showing the structure of the amplifier/noise cancel circuit 14.

In FIG. 3, the structure of the pixel circuit 12a corresponding to one pixel and the amplifier/noise cancel circuit 14 in a column connected to this pixel circuit 12a via the column selection signal line L4 is shown as an example. The amplifier/noise cancel circuit 14 includes a CDS circuit for canceling noise of fixed patterns included in image signals.

As shown in FIG. 3, a sample and hold switch 14a for controlling image signals input from the column selection signal line L4 is located in the amplifier/noise cancel circuit 14. A constant current source 14b for outputting constant current I is connected to the point where the sample and hold switch 14a and the column selection signal line L4 connect. A sample and hold capacitor C1 for holding a signal is connected to the output side of the sample and hold switch 14a. A reference voltage source 14c for supplying reference voltage VREF is connected to the other side of the sample and hold capacitor C1.

The point where the sample and hold switch 14a and the sample and hold capacitor C1 connect is connected to an input terminal of an amplifier 14d. A CDS capacitor C2 is connected to an output terminal of the amplifier 14d and the other side of the CDS capacitor C2 is connected to an input terminal of an amplifier 14e.

The point where the sample and hold capacitor C1 and the reference voltage source 14c connect is connected via a clamping switch 14f to the point where the CDS capacitor C2 and the amplifier 14e connect. By turning the clamping switch 14f to ON or OFF, the potential of a terminal on the amplifier 14e side of the CDS capacitor C2 can be fixed at reference voltage VREF supplied from the reference voltage source 14c or be separated from the reference voltage VREF.

An output terminal of the amplifier 14e is connected to the output bus 15a via the column selection transistor M1.

In the pixel circuit 12a, reset noise will be produced when a reset signal RST input to the reset transistor M2 goes into the OFF state. There is variation in threshold voltage VT for the reset transistors M2, so reset noise produced in each pixel circuit 12a is not constant. The CDS circuit included in the amplifier/noise cancel circuit 14 is used to reliably remove such reset noise from output signals. This CDS circuit removes reset noise by sampling image signals from the pixel circuit 12a including reset noise, by sampling again voltage output at the time of a reset, and by obtaining differential signals.

Now, the operation of the amplifier/noise cancel circuit 14 will be described by associating it with operation in the pixel circuit 12a.

First, a row selection signal SLCT is input to the gate electrode on the row selection transistor M4 in the pixel circuit 12a. In concurrence with or after that, a reset signal RST is input with the row selection transistor M4 kept in the ON state to put the reset transistor M2 into the ON state. As a result, the photodiode D1 is reset to reset voltage VR and the reset voltage VR is output to the column selection signal line L4. The above operation will be performed during a horizontal blanking period.

Next, after resetting by the reset voltage VR is completed, input of the reset signal RST is stopped. As a result, integration by the photodiode D1 is begun. At this time variation in the voltage of the source follower amplifier M3 corresponding to the amount of electric charge accumulated by the photodiode D1 is output to the column selection signal line L4 as the voltage of image signals.

Then the clamping switch 14f and the sample and hold switch 14a are put into the ON state. As a result, the voltage of the image signals is applied to the point where the sample and hold capacitor C1 and the amplifier 14d connect, and image signals corresponding to integration time are accumulated in both the sample and hold capacitor C1 and the CDS capacitor C2 as electric charge. The signals accumulated at this time include reset noise. After a certain period of time elapsed, the clamping switch 14f and the sample and hold switch 14a are put into the OFF state to hold sampled image signals.

To accumulate only reset noise in the sample and hold capacitor C1, a reset signal RST is input again to put the reset transistor M2 into the ON state. As a result, the photodiode D1 is reset to reset voltage VR and the reset voltage VR is output to the column selection signal line L4. In this case, the sample and hold switch 14a is put into the ON state, then the reset signal RST is put into the OFF state, and then the sample and hold switch 14a is also put into the OFF state after a predetermined period of time.

As a result of this operation, voltage, being the difference between reference voltage VREF and an image signal from which only reset noise was removed, will be produced at the point where the CDS capacitor C2 and the amplifier 14e connect. Therefore, then the image signal from which reset noise was removed will be sent to the output bus 15a by putting the column selection transistor M1 and the clamping switch 14f into the ON state in synchronization with a column selection signal from the horizontal scanning shift register 15.

Now, the arrangement of a fixed potential wiring between adjacent amplifier/noise cancel circuits 14 will be described. In this embodiment, GND potential will be obtained as constant potential by connecting a fixed potential wiring to an aluminum wiring for shading light located on the surface of a circuit area which light strikes.

Figure 4:
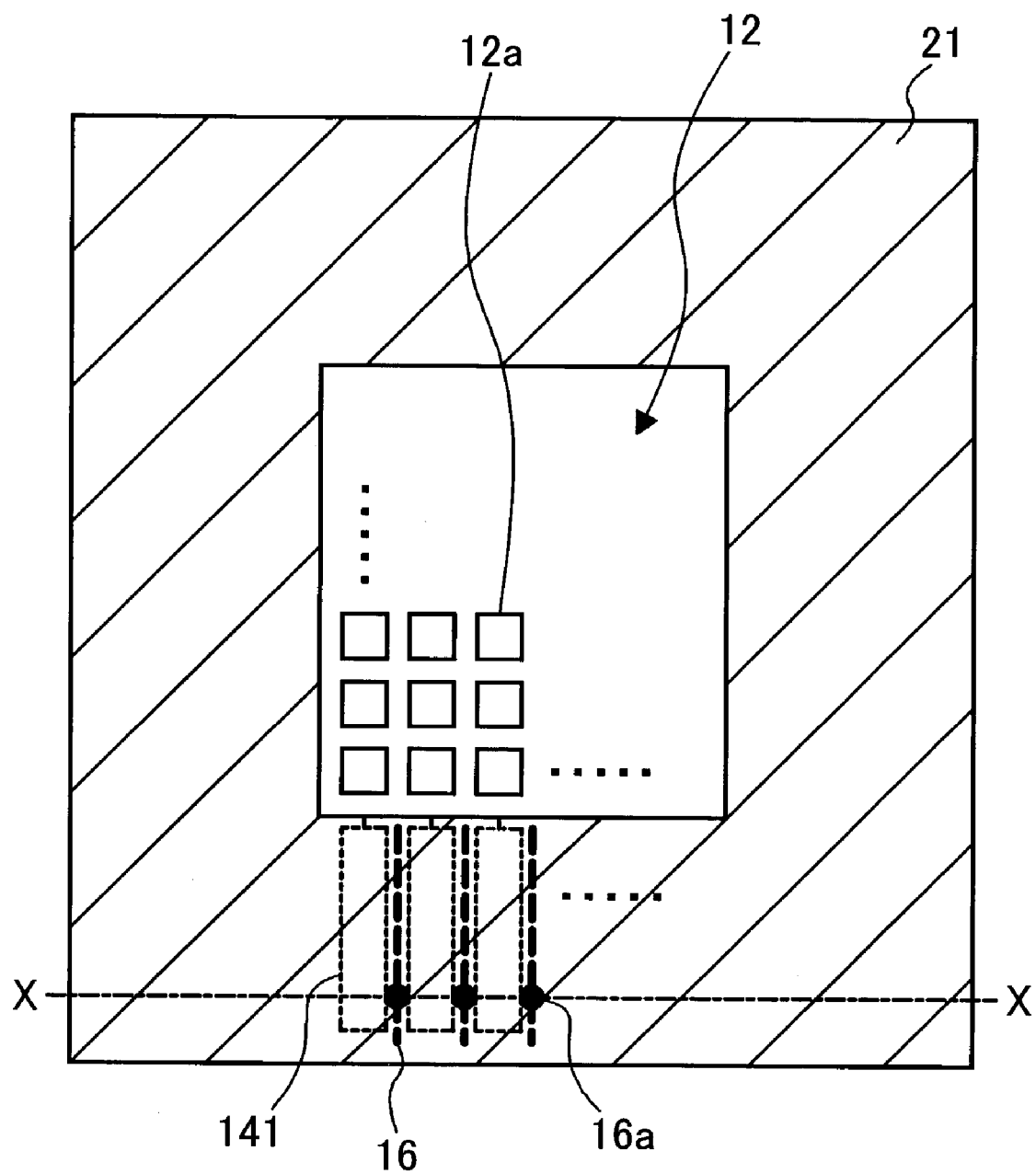
FIG. 4 is a plan view showing the positions in a CMOS image sensor according to an embodiment of the present invention where fixed potential wirings are located.

FIG. 4 is a plan view showing the positions in the CMOS image sensor 11 where fixed potential wirings are located.

FIG. 4 is a view showing the whole of a semiconductor chip, on which the CMOS image sensor 11 is formed, looked at from the direction from which light strikes the chip. An area in FIG. 4 where slant lines are drawn is an aluminum wiring for shading light 21. The aluminum wiring for shading light 21 is formed so that it will cover the whole of the semiconductor chip, and it has an opening only in the middle. The pixel section 12 where the pixel circuits 12a are arranged like a matrix is formed in an area on the semiconductor chip corresponding to the opening to sense light which strikes the pixel section 12. Actually, a color filter will be formed on the aluminum wiring for shading light 21, but it is omitted in FIG. 4. An area of the color filter over the pixel section 12 transmits each of the RGB colors corresponding to each pixel circuit 12a. An area of the color filter over the aluminum wiring for shading light 21 is, for example, of unicolor black or of black obtained by mixing the RGB colors so that it will not transmit light.

A cell 141 where the amplifier/noise cancel circuit 14 is formed is formed in an area shaded from light by the aluminum wiring for shading light 21. All the cells 141 in columns where the amplifier/noise cancel circuit 14 is formed have the same structure and are located parallel to one another to the arrangement of the pixel circuits 12a in a horizontal direction. Moreover, a fixed potential wiring 16 of aluminum is located between the cells 141 in adjacent columns where the amplifier/noise cancel circuit 14 is formed. The fixed potential wiring 16 in each column is connected to the aluminum wiring for shading light 21 by a contact hole 16a.

Figure 5:
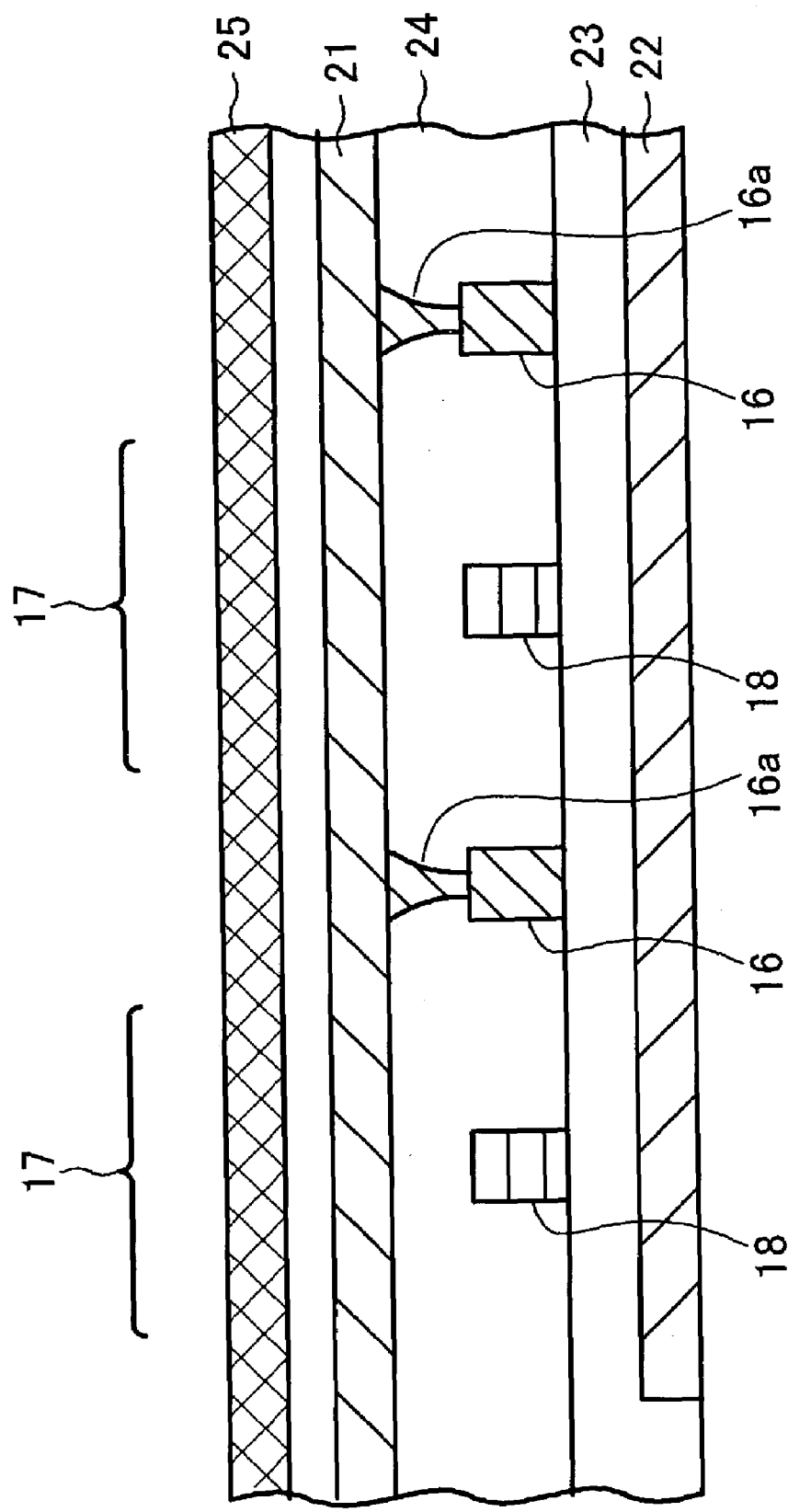
FIG. 5 is a sectional view showing a first example of how to form fixed potential wirings.

Now, an example of the positions where signal transmission wirings in the amplifier/noise cancel circuits 14 for transmitting image signals and the fixed potential wirings 16 are formed will be described by showing a section of the above semiconductor chip. FIG. 5 is a sectional view showing a first example of how to form the fixed potential wirings 16.

FIG. 5 is an enlarged fragmentary sectional view taken along the line X—X of FIG. 4. As shown in FIG. 5, a semiconductor chip where the CMOS image sensor 11 is formed has a multilayer structure. Signal transmission wirings 18 are formed over a power supply wiring 22 with an insulating layer 23 between. The aluminum wiring for shading light 21 is formed over the signal transmission wirings 18 with an insulating layer 24 between. A color filter 25 of, for example, black is located over the aluminum wiring for shading light 21. Power supply voltage VDD shared by circuits on this semiconductor chip is applied to the power supply wiring 22. The power supply wiring 22 will be located in, for example, a row direction (horizontal direction in FIG. 5). The aluminum wiring for shading light 21 is given GND potential in these circuits.

The amplifier/noise cancel circuit 14 in each column is formed in an area 17 in FIG. 5. That is to say, in each area 17 in the example shown in FIG. 5, one signal transmission wiring 18 for transmitting image signals in a column direction is formed in the amplifier/noise cancel circuit 14 in each column.

The signal transmission wiring 18 in FIG. 5 corresponds to a portion of the column selection signal line L4 which connects the source electrode on the row selection transistor M4 and the sample and hold switch 14a, a wiring which connects the sample and hold switch 14a and the sample and hold capacitor C1 and a wiring which connects the sample and hold switch 14a and the amplifier 14d, a wiring which connects the sample and hold capacitor C1 and the reference voltage source 14c, a wiring which connects the amplifier 14d and the CDS capacitor C2, a wiring which connects the CDS capacitor C2 and the amplifier 14e, or a portion of a wiring which connects the amplifier 14e and the column selection transistor M1 in the structure of the amplifier/noise cancel circuit 14 shown in FIG. 3.

The fixed potential wiring 16 is formed between the signal transmission wirings 18 in columns. The fixed potential wirings 16 and the signal transmission wirings 18 are formed in the same wiring layer. The fixed potential wiring 16 is located in a column direction so that it will be parallel to adjacent signal transmission wirings 18. Moreover, each fixed potential wiring 16 is connected to the aluminum wiring for shading light 21 by the contact hole 16a and is kept at GND potential.

By adopting the above structure, adjacent signal transmission wirings 18 are electrically shielded by the fixed potential wiring 16. This prevents image signals transmitted by adjacent signal transmission wirings 18 from interfering with each other. Distinct images therefore can be gotten without increasing power consumed by the CMOS image sensor 11 or without changing, for example, a capacitive element in the CMOS image sensor 11.

To keep the potential of each fixed potential wiring 16 constant, the aluminum wiring for shading light 21 at GND potential is used. That is to say, by connecting the fixed potential wiring 16 and the aluminum wiring for shading light 21 by the contact hole 16a, constant potential can be applied to the fixed potential wiring 16 without changing the multilayer structure of semiconductor chips. As a result, a rise in manufacturing costs caused by forming the fixed potential wiring 16 can be prevented and an increase in the volume of semiconductor chips can be minimized.

As described above, the amplifier/noise cancel circuit 14 in each column includes a CDS circuit. If space between CDS circuits in adjacent columns is narrow, the influence of interference on image signals will be especially great on wirings around capacitive elements located in the CDS circuits. If the structure of the amplifier/noise cancel circuit 14 shown in FIG. 3 is referred to, wirings connected to both ends of each of the sample and hold capacitor C1 and the CDS capacitor C2, being capacitive elements, may be formed in a column direction. In these areas, it is preferable that the fixed potential wiring 16 should be formed between wirings in adjacent columns. This will maximize the effect of preventing signal interference between adjacent pixels.

In the example shown in FIG. 5, one signal transmission wiring 18 which extends in a column direction is located in each area 17 where the amplifier/noise cancel circuit 14 in one column is formed. If a plurality of signal transmission wirings 18 are arranged in the same wiring layer in each area 17, then the fixed potential wiring 16 should be formed in the same way in the same wiring layer between the areas 17. In this case, the fixed potential wiring 16 may also be formed between the signal transmission wirings 18 arranged.

Moreover, in the example shown in FIG. 5, the aluminum wiring for shading light 21 at GND potential is used to keep the potential of the fixed potential wiring 16 constant. If the power supply wiring 22 is formed near the fixed potential wiring 16 as in the example shown in FIG. 5, the fixed potential wiring 16 may be connected to the power supply wiring 22 to get constant potential.

Figure 6:
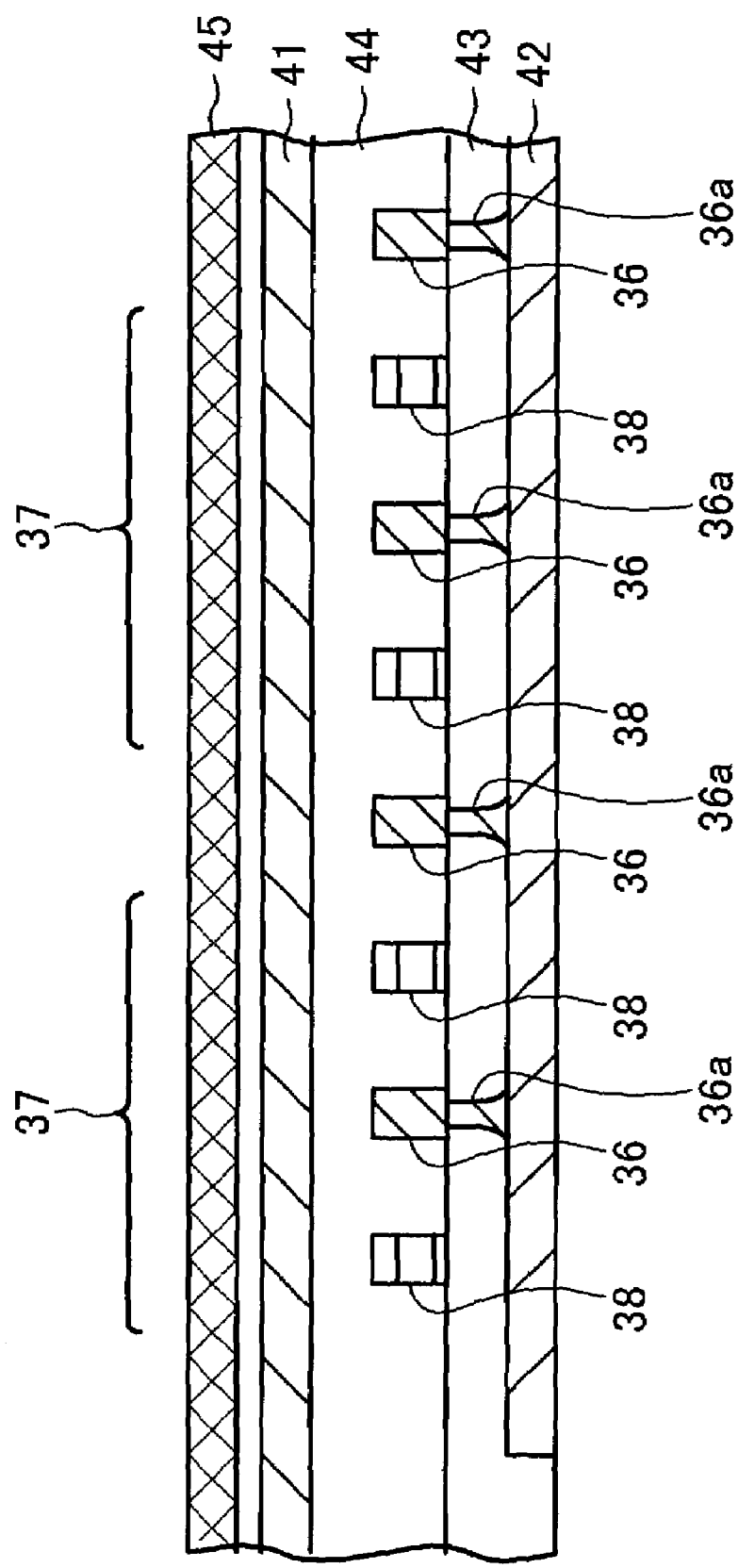
FIG. 6 is a sectional view showing a second example of how to form fixed potential wirings.
Figure 7:
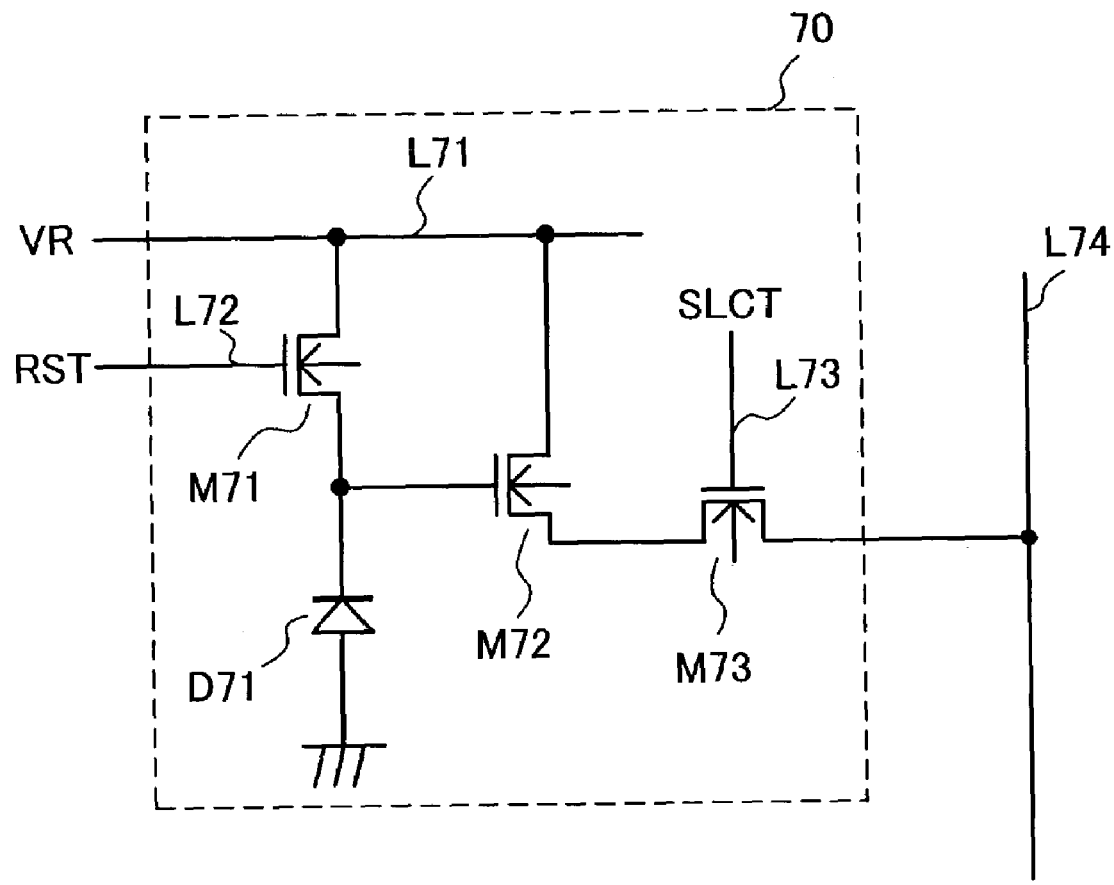
FIG. 7 is a view showing the structure of a pixel circuit in a conventional CMOS image sensor.
Figure 8:
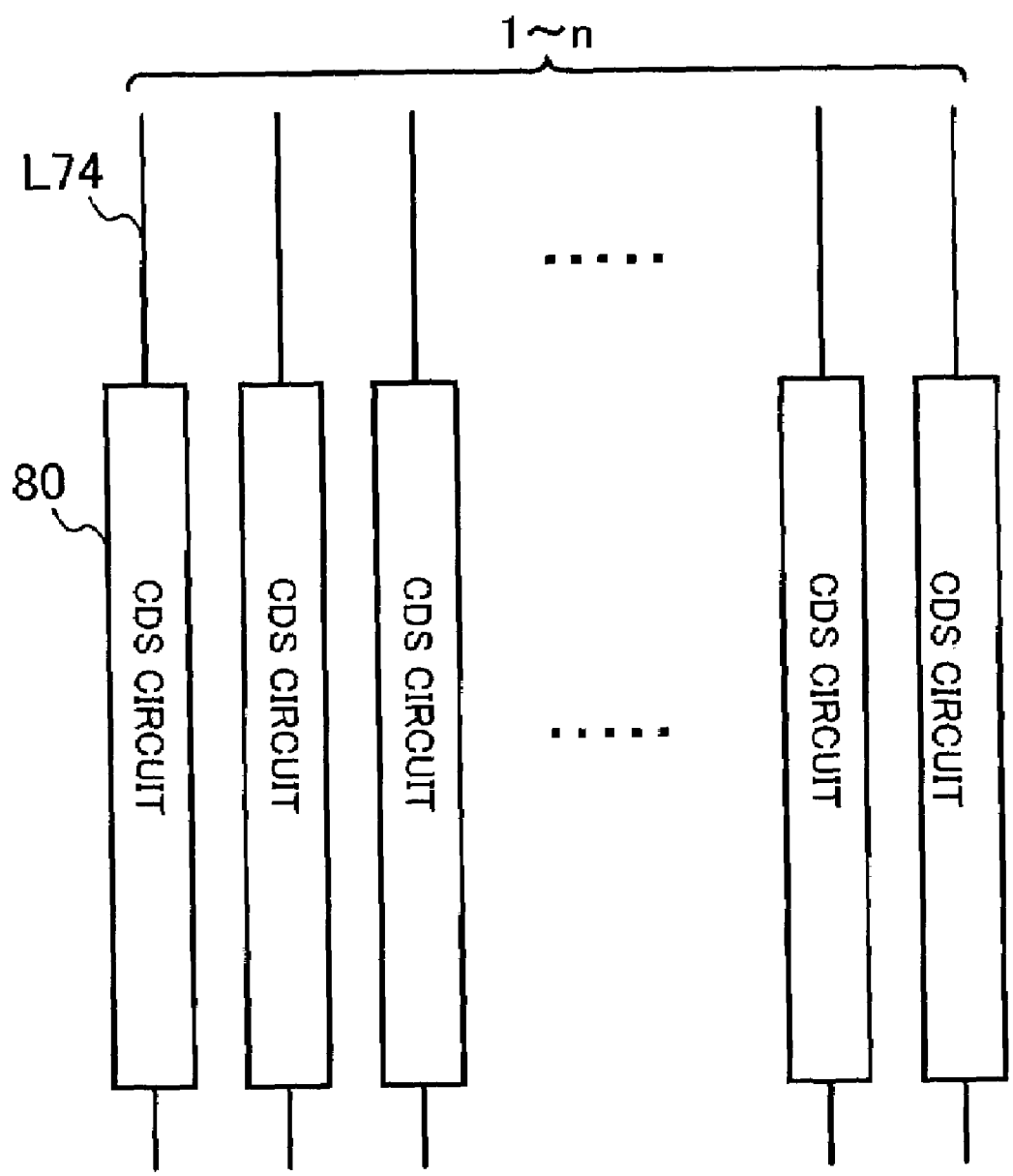
FIG. 8 is a view for intelligibly describing how to locate CDS circuits in circuits in a conventional CMOS image sensor.

FIG. 6 is a sectional view showing a second example of how to form fixed potential wirings.

FIG. 6 is a fragmentary sectional view of a semiconductor chip showing a portion around an area 37 where the amplifier/noise cancel circuit 14 is formed. This is the same with FIG. 5. The multilayer structure of this semiconductor chip is as follows. A power supply wiring 42, insulating layers 43 and 44, and an aluminum wiring for shading light 41 are formed from the bottom in that order. This is the same with FIG. 5. Moreover, a color filter 45 of black is located over the aluminum wiring for shading light 41.

Signal transmission wirings 38 are formed between the insulating layers 43 and 44 in each area 37 where the amplifier/noise cancel circuit 14 in a column is formed. In this case, two signal transmission wirings 38 are formed parallel to each other in the same wiring layer in the area 37 in each column.

Fixed potential wirings 36 are formed not only between the areas 37 where the amplifier/noise cancel circuit 14 in each column is formed but also between the signal transmission wirings 38 arranged in each area 37. This prevents image signal interference not only between columns but also between wirings in the amplifier/noise cancel circuits 14 in columns. As a result, images of higher quality can be gotten.

In FIG. 6, each fixed potential wiring 36 is connected to the power supply wiring 42 by a contact hole 36a to get power supply voltage VDD as constant potential. The power supply voltage VDD is shared in this semiconductor chip, so there are many cases in which the power supply wiring 42 is also formed near the area 37 where the amplifier/noise cancel circuit 14 is formed. In these cases, the power supply wiring 42 and the fixed potential wiring 36 should be connected by the contact hole 36a. By doing so, constant potential can be applied to the fixed potential wiring 36 without changing the multilayer structure of a semiconductor chip. This is the same with the example shown in FIG. 5.

In the above examples shown in FIGS. 5 and 6, signal transmission wirings are formed only in one wiring layer in an area where the amplifier/noise cancel circuit 14 is formed, but in reality there are many cases in which an area where signal transmission wirings are formed in a plurality of wiring layers exists. In these cases, fixed potential wirings should be formed parallel to signal transmission wirings so that they will correspond to the positions where the signal transmission wirings in each wiring layer are formed.

Moreover, in the above examples shown in FIGS. 5 and 6, the aluminum wiring for shading light 21 and the power supply wiring 42 connected to the fixed potential wirings 16 and 36 respectively are wirings for supplying voltage shared in a semiconductor chip, so their potential may vary according to conditions in the semiconductor chip. In this case, the potential of the fixed potential wirings 16 and 36 will also vary according to variation in the potential of these wirings. Therefore, variation in the potential of the fixed potential wirings 16 and 36 may influence the signal transmission wirings 18 and 38 adjacent to the fixed potential wirings 16 and 36 respectively and transmitted image signals may include noise.

To prevent such variation in the potential of the fixed potential wirings 16 and 36, constant voltage should be supplied to the fixed potential wirings 16 and 36 via an independent dedicated wiring separated at a wiring pad located on the semiconductor chip. Alternatively, constant voltage should be supplied to the fixed potential wirings 16 and 36 from an independent voltage source located outside the semiconductor chip. In this case, reference voltage VREF supplied into the amplifier/noise cancel circuit 14 may also be supplied to the fixed potential wirings 16 and 36.

As has been described in the foregoing, with the CMOS image sensor according to the present invention signal processing circuits are located parallel to one another and each of fixed potential wirings parallel to one another is located between two of the signal processing circuits. As a result, adjacent signal processing circuits are electrically shielded by a fixed potential wiring. This prevents image signals transmitted in adjacent signal processing circuits from interfering with each other. Therefore, distinct images can be gotten without increasing consumption of power or changing an element in a circuit.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A CMOS image sensor for getting images by outputting in order image signals sensed in each of pixel areas arranged like a matrix on the basis of X-Y addressing, the sensor comprising:
    a plurality of pixel circuits arranged like a matrix and each including a photoelectric conversion element to make the photoelectric conversion of incident light for outputting the image signals corresponding to one pixel;
    a plurality of signal processing circuits arranged by the number equal to that of the pixel circuits arranged in a horizontal direction and connected to all the pixel circuits arranged in a vertical direction for performing predetermined signal processing on the image signals from each of all the pixel circuits arranged in the vertical direction;
    a horizontal scanning circuit for switching and outputting in order the image signals from the plurality of signal processing circuits; and
    fixed potential wirings parallel to one another and each located between two of the plurality of signal processing circuits arranged.

2. The CMOS image sensor according to claim 1, wherein the fixed potential wirings are always formed in the same wiring layer where signal transmission wirings in the plurality of signal processing circuits for transmitting the image signals are formed.

3. The CMOS image sensor according to claim 1, wherein if the signal transmission wirings in each of the plurality of signal processing circuits are arranged parallel to one another in the same wiring layer, the fixed potential wirings are also located between any two of the signal transmission wirings.

4. The CMOS image sensor according to claim 1, wherein the fixed potential wirings are set to GND potential.

5. The CMOS image sensor according to claim 1, wherein if a wiring for shading light having an opening only over an area where the plurality of pixel circuits are arranged for preventing the incident light from striking a portion other than the area is further located, the fixed potential wirings are connected to the wiring for shading light.

6. The CMOS image sensor according to claim 5, wherein the wiring for shading light is set to GND potential.

7. The CMOS image sensor according to claim 1, wherein if common power supply voltage shared by each of the plurality of pixel circuits and the horizontal scanning circuit is supplied, the fixed potential wirings are set to the common power supply voltage.

8. The CMOS image sensor according to claim 1, wherein the fixed potential wirings are supplied with voltage via an independent voltage supply wiring separated at a wiring pad portion located in a semiconductor chip formed.

9. The CMOS image sensor according to claim 1, wherein the fixed potential wirings are supplied with voltage from an independent voltage source located outside a semiconductor chip formed.

10. The CMOS image sensor according to claim 1, wherein each of the plurality of signal processing circuits includes a correlated double sampling circuit.

11. The CMOS image sensor according to claim 10, wherein if each of the correlated double sampling circuits includes a capacitive element for sampling the image signals from each of the plurality of pixel circuits connected to the correlated double sampling circuits, the fixed potential wirings are located parallel to the signal transmission wirings connected to both ends of the capacitive element.

12. The CMOS image sensor according to claim 10, wherein if the correlated double sampling circuits are supplied with dedicated reference voltage, the fixed potential wirings are set to the reference voltage.

* * * * *